United States Patent [19]

Fujita et al.

[11] Patent Number: 4,668,527
[45] Date of Patent: May 26, 1987

[54] METHOD FOR AMORPHIZING A MATERIAL BY MEANS OF INJECTION OF EXOTIC ATOMS INTO A SOLID WITH ELECTRON BEAMS

[75] Inventors: Hiroshi Fujita, Ibaraki; Naoto Sumida, Osaka, both of Japan

[73] Assignee: Osaka University, Suita, Japan

[21] Appl. No.: 776,519

[22] Filed: Sep. 16, 1985

[30] Foreign Application Priority Data

Mar. 6, 1985 [JP] Japan ................................. 60-43992

[51] Int. Cl.⁴ ............................................. B05D 3/06
[52] U.S. Cl. .................................... 427/35; 250/492.3
[58] Field of Search ........................ 427/35; 250/492.3

[56] References Cited

U.S. PATENT DOCUMENTS 2,911,533 11/1959 Damask ............................ 250/492.3
3,718,502 2/1973 Gibbons ............................... 148/191

OTHER PUBLICATIONS

Dienes et al, "Radiation Effects in Solids" Interscience Publishers Inc., New York (1957) pp. 58-60, 77-79, 82, 83 and 90-92.

Primary Examiner—John H. Newsome
Attorney, Agent, or Firm—Spencer & Frank

[57] ABSTRACT

A method for amorphizing a material comprises attaching a thin film consisting of exotic atoms to a parent material, irradiating the two layer material under given conditions of irradiation from the side of the thin film with electron beams, and injecting forcibly the exotic atoms into the parent material to change the material into an amorphous material. This method can produce amorphous materials having new functions.

2 Claims, 5 Drawing Figures

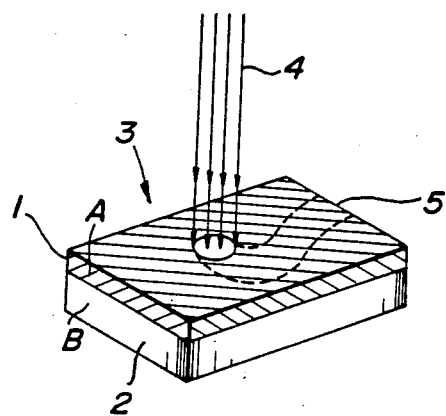
FIG._1a
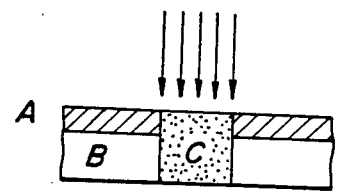
FIG._1b
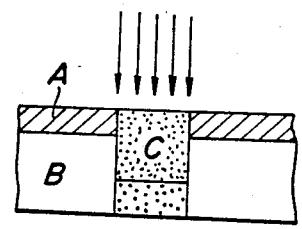
FIG._1c
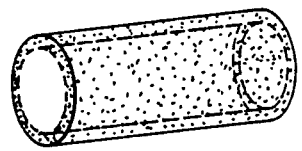
FIG._2a
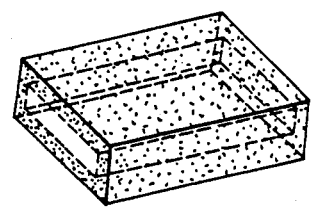
FIG._2b

METHOD FOR AMORPHIZING A MATERIAL BY MEANS OF INJECTION OF EXOTIC ATOMS INTO A SOLID WITH ELECTRON BEAMS

BACKGROUND OF THE INVENTION

1. Field of the Invention

This invention relates to a method for amorphizing materials, the method using injection of exotic atoms into a solid with electron beams (injection of atoms induced with electron beams) in the field of materials engineering.

2. Background of the Art

In the field of materials engineering, properties of amorphous materials have been noted and materials having new functions developed by using the properties. As methods for producing amorphous materials, (I) the melt quenching method, (II) the vacuum deposition method and sputtering method, (III) the particle beam (including electron beam) irradiation method, etc. are established.

The melt quenching method of (I) has inevitably the following disadvantages.

(1) A greater quenching rate than a certain value is required all over the material in order to obtain a homogeneous amorphous material, so that the form is limited to a thin ribbon or line form having thickness of several tens $\mu$m at most. (2) As the realizable quenching rate is limited, depending on the elements and the composition of alloys, some specific materials are not amorphizable. Further, an obtained material might be an aggregate of microcrystals or a mixture of amorphous materials and microcrystals. (3) For producing composite materials of amorphous and crystalline material, another technique for fusing the two is required, and the realizable combination is also limited.

The amorphous materials produced by the vacuum deposition method or the sputtering method of (II) are more homogeneous than the obtained materials by the method of (I). However, these methods have the following disadvantages.

(1) The film thickness is at most several $\mu$m. (2) The composite material is produced by controlling the temperature of a substrate on which a thin film is deposited. However, the thickness over the whole film of the obtained material is at most several tens $\mu$m. (3) As atoms are aggregated on the substrate after the atoms are vaporized, the difference of vapor pressure and sputtering rate of atoms constituting alloys causes the difficulty of controlling a composition of amorphous alloys.

The method for irradiating particle beams containing electron beams of (III) (Japanese Patent Application No. 58-125,549) is a useful method and can dissolve many disadvantages existing in the methods of (I) and (II). However, the successful conventional examples are limited to intermetallic compounds having definite components. Therefore, the method is silent about application to the field of electron materials and properties change remarkably with a little change of the components of alloys.

SUMMARY OF THE INVENTION

For dissolving the above disadvantages, this invention provides a method comprising attaching a thin film of an element al component to be injected into a material to a crystal of the material by the methods of vacuum deposition, sputtering, beam annealing, electrodeposition, etc., irradiating the material from the side of the thin film with electron beams having high energy, and injecting atoms of the thin film into the crystal. The mixed layer which is produced in the regions irradiated with electron beams changes into an amorphous layer having any composition, any thickness and any amorphous degree.

According to this invention, by the advantages of the electron irradiation method by which the above-mentioned amorphous materials are produced, amorphous materials and crystals having any composition can be combined. Further, alloys which are unable to amorphized by electron irradiation can be amorphized by mixing other atoms therewith. Therefore, materials having new functions are efficiently developed by the method for producing the amorphous materials.

BRIEF DESCRIPTION OF THE DRAWING

FIG. 1 is a schematic perspective view of the method for amorphizing of examples of this invention in which FIG. 1(a) shows a condition of irradiating a material having a two layer structure in any form from the side of a thin film with high energy electrons. The material consists of a parent material (B) and a thin film (A) which is attached to the parent material;

FIG. 1(b) shows a longitudinal sectional view of the irradiated region, in which the thin film (A) and the parent material (B) have changed into an amorphous layer (C). As the parent material (B) is thin, the amorphous layer (C) spreads into the longitudinal direction of the thickness of the crystal; and FIG. 1(c) shows a condition in which the irradiated region changes into the amorphous layer of the thin film (A) and the parent material (B). As the parent material is thick, point defects are introduced by electron irradiation into the crystal under the amorphous layer (C). The point defects are shown by bigger black points than the points of the layer (C).

FIG. 2 is a schematic view of examples using the method of this invention in which FIG. 2(a) shows an amorphous material which covers the surface of a bar or a pipe; and FIG. 2(b) shows an amorphous material which covers the surface of a material having complex sections shown, for example, as rectangles.

DESCRIPTION OF THE PREFERRED EMBODIMENTS

In FIG. 1, a thin film (A) 1 containing an element to be injected adheres to a metal crystal (B) 2 which is formed into any form by the methods of vacuum deposition, sputtering, beam annealing, electrodeposition, etc. The obtained material has a two layer structure 3 consisting of the thin film (A) and the crystal (B), as shown in FIG. 1(a), and is irradiated from the side of the thin film (A) with electron beams 4. The dashed lines show irradiated traces.

The electron beams 4 used for irradiation must have sufficient energy to displace the atoms which are contained in the thin film (A). However, depending on the elements, compositions and thickness of amorphous materials, electron beams having sufficient energy to displace atoms which are also contained in the crystal (B) are utilized.

Irradiation intensity is suitably selected by the electron energy, displacement threshold energy of atoms in the thin film (A) (and the crystals (B)), and the thickness of amorphous materials to be produced. However, the temperature having the the material of two layer structure during irradiation referred to as irradiation temperature hereinafter) must be kept lower than the critical temperature at which mixed layer (C) of the thin film (A) and the crystal (B) is transformed into the amorphous state.

Under the above-mentioned conditions, when electrons having high energy are irradiated onto the thin film (A) and the crystal (B), the electrons collide with the thin film (A) to displace atoms thereof. The atoms are then injected into the crystal (B). As a result, a mixed layer (C) of A and B is produced in the crystal (B) and the crystalline state of the layer changes into an amorphous state.

The materials which are useful in this invention are semiconducting materials, ceramic materials, metallic materials, etc. Of the semiconducting materials, if the crystals are Si, thin films consisting of exotic atoms such as Al, Fe, Cu, Ag, Mo, Au, almost all metals, and non-metals such as N, C, B, etc., can be used. Further, the above elements can be injected into almost all semiconducting materials such as Ge, GaAs, etc.

In ceramic materials, including oxides (such as $Al_2O_3$, $ZrO_2$, etc.), nitrides (such as $Si_3N_4$, etc.) and carbides (such as SiC), the other elements are injected with electron beams into the above compounds under nonequilibrium conditions.

In metallic materials, by combining the metal atoms which constitute intermetallic compounds, by using metal atoms which can be made by conventional methods including the (quenching method, the sputtering method, the deposition method, etc.), or by mixing forcibly constituents alloy which do not produce solid solutions with each other, such as two solid phases or two liquid phases, the materials can be amorphized.

The required conditions of irradiation for amorphizing is decided by the selection of materials and exotic atoms injected into the materials. In general, the preferable conditions are acceleration voltage of 200 KV or more, an intensity of electron beams of $10^{18}$ e/$cm^2$·sec or more, and an irradiation temperature of 100° C. or less.

This invention is that atoms of the thin film are injected to the solid and are mixed at the interface between thin film and solid by high energy electrons. Therefore, the following advantages are obtained.

(1) As electron beams penetration is greater than that of other particle beams, as shown in FIG. 1(b), mixed layers (C) (amorphous layers) having thickness of several hundreds μm can be obtained. (2) The point defects which have a produced by the irradiation are Frenkel pair form, so that amorphous layers having homogeneous composition can be produced. As shown in FIG. 1(c), point defects under the amorphous mixed layer (C) of the crystal (B) can be recovered by heat treatment without denaturalizing the amorphous materials. (3) The diameter of electron beams can be easily changed with electron lenses. The value of the diameter can be minimized to about 1 nmφ. As a result, regions having extremely fine geometries can be amorphized. (4) By using the interaction between high energy electrons and a crystal (for example, channeling phenomenon of electron beams, diffraction phenomenon, etc.), amorphous layers are distributed in the direction of the depth of the crystal and especially thick amorphous layers can be made.

An example of conditions of irradiation by which the mixed layer of the thin film (A) and the crystal (B) is amorphized by the method of this invention is shown in the following table.

TABLE

| Material | | Energy of electron beams | Intensity of electron beams | Irradiation temperature | Irradiation time | Thickness of amorphous material |
| --- | --- | --- | --- | --- | --- | --- |
| thin film (A) | crystal (B) | | | | | |
| Au (20 mm) | Si | 2.5 MeV | $1 \times 10^{20}$ e/$cm^2$·sec | 170° K. | 15 min | 50 nm |

(EXAMPLE)

A single crystal of silicon of <111> orientation was formed with an ultrasonic processing machine into a disk having a 3 mm diameter and having a hollow in the center. The disk was chemically polished to obtain a thin film having a hole. A film of Au of about 100–200 Å thick was evaporated on one side of the thin film at a vacuum of $10^{-5}$ Torr or less. The obtained double film was irradiated with electron beams of 2–2.5 MeV from the evaporated side of Au for 10–30 minutes (irradiation intensity: $10^{20}$ e/$cm^2$·sec or less). The irradiation temperature was changed from −110° C. to room temperature. The production of the Au-Si amorphous material was recognized by its electron diffraction image and its dark field image.

The effect of this invention is as follows.

(A) According to the method of this invention, by choosing the thin film attached to the surface, the kinds of injecting atoms can be selected freely, and two or more kinds of atoms can be injected at the same time or individually. Therefore, materials which are unable to amorphized by conventional methods can be amorphized by injecting any atom of proper quantity with electron beams.

(B) The rapid quenching process which is used in the conventional method is unnecessary. Therefore, if the desired material is big and complex in shape, the surface layer (several μm-several hundreds μm) can be amorphized. As a result, composite materials can be easily produced by covering the surface of pipes having several kinds of calibers, wire materials, and plate materials with amorphous materials as shown in FIG. 2.

(C) In the conventional methods, only composite materials of amorphous materials and crystals having the same chemical composition can be produced. However, according to this invention, as the chemical composition of amorphous layers can be widely changed, the properties of the composite materials can be also widely changed. This invention is especially useful in the field of semiconductor materials, the properties of which are remarkably changed by a little change in the chemical compositions thereof.

(D) The diameter of electron beams can be easily minimized to about 1 nmφ with electron lenses. The electron beams can be also deflected and moved. Therefore, the amorphous regions which are produced by mixing the thin film (A) and the crystal (B) can be limited to very small regions having a diameter down to about 1 nmφ or can be changed into any dimension and form (a circle, a wire, a plate, etc.). Further, the depth of the mixed amorphous layer (C) can be controlled by changing the conditions of irradiation by electrons having high energy. Therefore, composite materials which have the combination of any geometrical form of the amorphous materials and the crystal are realizable.

(E) In the method of this invention, when the conditions of irradiation forming point defects in the crystal are used, by the synergic effect of the great penetration of the electron beams and the enhanced diffusion depending on the produced point defects, the thickness of the amorphous mixed layers (C) of atoms in the thin film and crystal can be easily increased to several nm. If the crystal is a single crystal, the penetration of electron beams becomes greater by the channeling phenomenon of the high energy electrons. Further, when the material is irradiated under the condition that stress is applied to the material, diffusion of the point defects can be enhanced, so that thick mixed layers (C) can be produced. When the effect of this invention is utilized, the thickness of amorphous materials can be increased further.

What is claimed is:

1. A method for amorphizing a material by means of injection of exotic atoms into a parent material using an electron beam, the method comprising:

providing a structure consisting of a crystalline parent material and a thin film comprised of at least one type of exotic atom provided on one surface of said crystalline parent material;

irradiating a predetermined region of said structure under given conditions of irradiation with an electron beam directed toward said thin film to cause injection by forcible displacement of at least one type of said at least one type of exotic atoms from said thin film into said crystalline parent material to provide a zone of mixed atoms in the irradiated region, which zone of mixed atoms is amorphous, said electron beam having an intensity of $10^{18}$ e/cm$^2$·sec or more under an acceleration of 200 KV or more, and said irradiation taking place at an irradiation temperature of 100° C. or less.

2. The method of claim 1, wherein said at least one type of exotic atom is Au and wherein said crystalline parent material is Si.

* * * * *